United States Patent [19]

Lesieur

[11] 4,115,818

[45] Sep. 19, 1978

[54] APPARATUS FOR MONITORING EVOLUTIVE INFORMATION

[75] Inventor: Jean-Paul Lesieur, Massy, France

[73] Assignee: Compagnie Internationale pour l'Informatique Cii Honeywell Bull, Paris, France

[21] Appl. No.: 758,840

[22] Filed: Jan. 12, 1977

[51] Int. Cl.² .................. G11B 5/00; H04N 5/795
[52] U.S. Cl. ........................... 360/5; 360/35; 360/36; 360/37
[58] Field of Search ................. 360/5, 35, 37, 36; 358/301

[56] References Cited

U.S. PATENT DOCUMENTS

| | | | |
|---|---|---|---|
| 3,243,798 | 3/1966 | Senders | 360/5 |
| 3,461,429 | 8/1969 | Gray | 360/5 |
| 3,549,799 | 12/1970 | Sander | 360/5 |
| 3,787,827 | 1/1974 | Stout | 360/5 |
| 3,911,484 | 10/1975 | Mutou | 360/35 |
| 4,006,737 | 2/1977 | Cherry | 360/5 |
| 4,035,843 | 7/1977 | Tanimura | 360/35 |

*Primary Examiner*—Jay P. Lucas

*Attorney, Agent, or Firm*—Cameron, Kerkam, Sutton, Stowell & Stowell

[57] ABSTRACT

A system for monitoring evolutive information data picked up at various points in associated informatics equipment and analyzing selected information data sequences comprises means for permanently recording information data on a continuous track magnetic carrier having automatic erase means at the end of each track. Recorded sequences of information data are controllably displayed after the data has been written in. At the write-to-read switching operation, an index marking the origin of the information sequences to be displayed is recorded on a special track of the carrier and said index is thereafter used for synchronization of the display on a CRT. A clock pulse counter circuit under the control of an operator enables him to vary the origin of the displays. The clock pulse counter circuit comprises a clock pulse counter, a manually operable pulse count selector and a comparator, the output of which is connected to deliver a trigger pulse, each time the count of the counter agrees with the pulse count manually selected by the operator which may thus vary the origin of the display without losing the true origin of the information data sequences stored on the carrier.

8 Claims, 2 Drawing Figures

APPARATUS FOR MONITORING EVOLUTIVE INFORMATION

BACKGROUND OF THE INVENTION

The present invention concerns improvements in or relating to systems and devices enabling the monitoring of evolution with respect to the time of logic and analog information data collected from a plurality of points in an information handling and processing equipment and enabling, when necessary, the inspection of sequences of such logic and analog information data for mainly locating faults occurring in the equipment in the course of the time.

Such systems and devices comprise means for permanently recording the information data to be monitored on an endless multi-track magnetic carrier such as a magnetic disc, drum or looped tape. Each track is allotted to a particular point of the equipment from which data is collected. Each track is associated with an erase magnetic head, a writing head positioned just after the erase head or combined therewith, and a reading head. Such means consequently constitute an evolutive information store of a restricted capacity, the content of which progressively changed at each revolution of the looped multiple track recording carrier.

When, in the data handling and processing equipment, an event occurs which may denote a fault or a misoperation, the erase and/or writing heads are inhibited and the reducing heads are activated when they were not already operative. The record is maintained as is without further changes and a repetitive read-out operation of the thus stored data sequences is initiated. To each reading head is associated a visual display means, such for instance as a cathode-ray oscilloscope. When multiple beam cathode ray tubes are used, their number is less than the number of tracks, consequently less than the number of reading heads. The operator can inspect the displays either by mere sight or from graphical records thereof.

During this repetitive display, at least, the X-scan (or the $\theta$-scan, as the case may be) of the cathode ray tubes must be synchronized with the passage of the looped record under the reading heads. The synchronization is obtained from a read-out of an index written on an additional track of the record carrier. Each read signal of said index triggers the X (or $\theta$) scanning control circuits of the cathode-ray tubes. The index could have been written on its track before the occurrence of the repetitive read-out of the record or at the time the erase and/or writing heads are inhibited.

During at least the repetitive read-out operation, means enable the operator to adjust the X (or $\theta$) scanning span on the cathode ray tubes so that he may choose the extent of the field of the record he wishes to inspect from the display. However, as such means do not enable the modification of the origin of the display, since the synchronization track carries a single index, further means are necessary for enabling the operator to control such a modification.

Means for enabling an operator to adjust or modify the origin of the display are provided in French Pat. No. 2,253,439. In this patent, two magnetic heads are associated to the origin index track of the carrier. The upstream head in the direction of movement of the carrier is a reading head, the downstream head in said direction is a writing head. The reading head also is an erasing head (or an erasing head immediately follows the reading head. The output of the reading head is connected to the input of the writing head through an adjustable delay connection so that any index which has been read (and erased) is re-written at a location of the track shifted by such a delay with respect to its preceding location on said track. In this patent there is further described a circuit which ensures the writing of the synchronization index on its track at the time instant of switching of the system from the recording condition to the displaying inspection condition, so that the index initially marks the true origin of the information sequence which remains stored on the carrier.

Actual use of the system described in said French Patent reveals two counterparts or drawbacks. The first drawback is a technological one as it is necessary to physically mount two spaced magnetic heads for the index track. The second drawback and the more important is that, as soon as the inspection begins, at the first change of location of the index on its track, the true origin of the information sequence which is inspected is lost. This loss obviously complicates the interpretation of the display.

It is an object of the invention to provide an improved device which does not present such drawbacks.

SHORT SUMMARY OF THE INVENTION

According to a feature of the invention, once the synchronization index marking the origin of an information sequence is written at an appropriate location of the index track of the carrier, each read-out signal of said index controls the application of a series of clock pulses to a pulse counter and the operator is equiped with means for predetermining the maximum count of said counter so that when the counter passes by the said predetermined maximum count, it stops and issues a signal which is applied as a synchronization signal to the X (or $\theta$) scan control circuit of the cathode ray oscilloscopes. By progressively modifying the count of the counter, the operator can inspect and analyze all parts he may wish to inspect and analyze without loosing the true origin of the information sequence.

Preferably, the clock pulses are read from a clock track of the record carrier. This ensures a protection against any variations of speed of the carrier during each turn thereof.

According to a preferred embodiment, the predetermination of the count of the clock pulse counter at which the synchronization signal is applied to the display devices is obtained from the application of a predetermined count code to one input of a code comparator. The count code is adjusted by the operator whereas the other input of said code comparator is fed with the varying count code from the clock pulse counter. When the count from the counter reaches the count preset by the operator on the first cited input of the comparator, the comparator issues a signal which both resets the counter and activates the X (or $\theta$) scan control of the display cathode ray tubes.

BRIEF DESCRIPTION OF THE DRAWINGS

The invention will be described in full detail with reference to an illustrative example of embodiment disclosed on the accompanying drawings, which.

Figure 1:
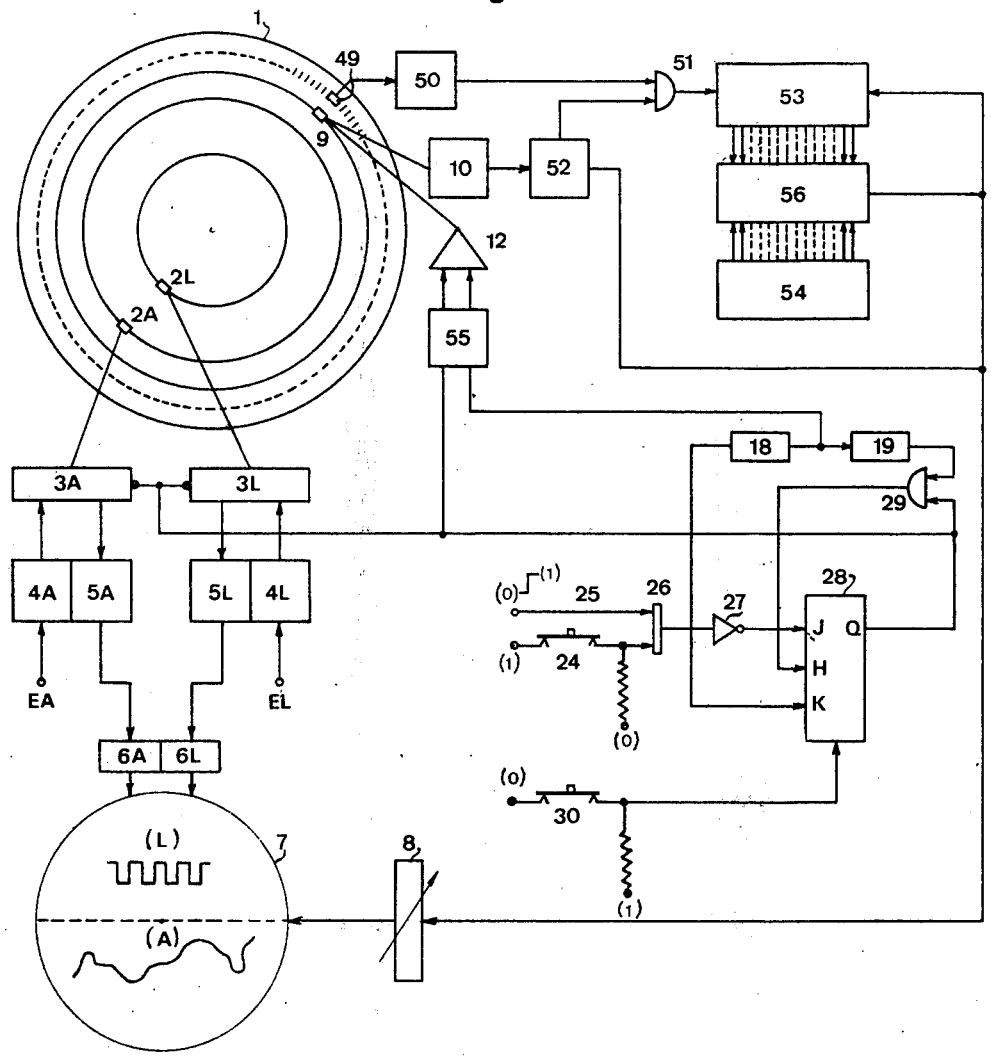
FIG. 1 shows the circuit diagram of this embodiment.

Any alternative embodiment of the invention may be directly derived from the description of this preferred embodiment.

DETAILED DESCRIPTION

It will be seen from the following description that the present invention provides a system for varying the origin of a visual display on a CRT of information data recorded on a multi-track record. An index or "tag" is recorded on a special track of the record. When information to be recorded on the track is no longer written in, the operation is switched to a read-out operation. A count is initiated on a presettable counter each time the "tag" is read. The output of the counter at its maximum count is utilized to synchronize a time-basis of the visual display device by triggering a time basis circuit connected to the CRT.

For the sake of simplicity, only two information tracks are shown on such a record carrier as a magnetic disc 1. For the sake of simplicity too, a single two-beam cathode ray oscilloscope is shown at 7 for displaying the information contents of the two tracks when desired. This cathode ray oscilloscope is of the X-Y scanning type, its two beams are simultaneously controlled along the X direction.

Illustratively, one of the represented tracks is allotted to analog information and the magnetic head 2A can be used both for writing and reading operations. The other track is allotted to logic information and the magnetic head 2L can be used for both writing and reading operations. The upper beam of the cathode ray tube is devoted to logic information display (L) and the lower beam, to analog information display (A). The vertical deflection circuits for said beams are indicated at 6A and 6L. The horizontal X-deflection control circuit common to the two beams is shown at 8. It includes a time-basis of the trigger controlled type, i.e. a time base scan control circuit which only operates on the application of a trigger pulse to a control activation input thereof, and is de-activated after a single scan until a next trigger pulse is received on said trigger input.

The magnetic head 2A is connected to a write-control circuit 4A and to a read-control circuit 5A through a connection inverter switch 3A. Samely, the magnetic head 2L is connected to a write-in control circuit 4L and a read-control circuit 5L through a connection inverter switch 3L. For recording analog information, applied to the input terminal EA, the circuit 4A conventionally includes a frequency or time modulator of the signals applied at 2A and for reading out analogic information in a form appropriate to the application on the vertical deflection control circuit 6A, the read-out circuit 5A includes a frequency or time demodulator of the signals from the magnetic head 2A.

Similarly, as concerns the logic information, applied at EL to the circuit 4L, said circuit includes logic signal shaping means adapted to feed the magnetic head 2L when operating as a writing head, and the read-out circuit 5L includes means reshaping the read-out signals for their application to the vertical deflection control circuit 6L of the cathode ray tube 7.

The informatics system from which come the signals EL and EA is not shown, inasmuch as this system is not part of the invention proper.

A write/read magnetic head 9 is associated to the synchronization index track of the record carrier. The output of this head is connected to a read-out shaping circuit 10. The write input of the head 9 is connected to the output of an amplifier 12 of the writing currents which are generated in a circuit 55 under a control to be later described.

The system according to the invention necessitates a local clock pulse generator. In the embodiment of FIG. 1, this generator consists of a further special track of the record carrier 1 which has been pre-recorded and to which is associated a reading head 49. The signals from the head 49 are shaped and amplified in an amplifier 50. The frequency of the clock pulses has been selected according to the span of the steps by which the display is wished to be shifted by the operator. Illustratively, this frequency may be of about 1 megahertz.

In a system according to the invention, the synchronization index must mark the true origin of any information sequence to inspect from the display. Consequently, the index must be only written at the switching of the recorder from write to read. The write-to-read switching is controlled by a change of condition of a bistable circuit 28. In the shown embodiment, this circuit consists of a so-called JHK type, that is the condition or state of the circuit can only be switched by application of a control pulse on its control input H once the condition defining inputs J and K have been placed in the suitable complementary conditions for defining the state to which the control pulse applied to H will bring the circuit 28.

The bistable circuit 28 is provided with an output Q which may take either one of the two logical levels (1) and (0) according to the relative level conditions of the inputs J and K at the time instant a switching control pulse is applied to the control input H. The level conditions of the inputs J and K are defined by the level conditions of the output of an OR-circuit 26 having a direct connection to the input K and a connection including an inverter 27 to the input J. The inputs of the OR-circuit 26 are respectively connected to two control inputs of the system. Input 25 is adapted to receive, when necessary, a logical level (1) whereas it normally applies a logical level (0) to its input to the OR-circuit 26. Said input 25 may be termed an "automatic control" input since it is as activated when an error is automatically detected in the informatics equipment with which the system cooperates. It is well known that such informatics equipments always embody a number of automatic error detectors so that it suffices to OR-connect the outputs of such error detectors to the input 25. Input 24 includes a push-button 24 for a manual actuation of a change of the logical level (0) to the logical level (1) on the corresponding input of the OR-circuit 26. When both the inputs 24 and 25 apply a logical level (0) to the OR-circuit 26, input J is at the logical level (1) since the output of 26 to J passes through an inverter 27 whereas input K is at the logical level (0) as being directly connected to the output of the OR-circuit 26.

The bistable circuit 28 is further provided with a so-called "forcing to one" input, as conventional in this type JHK of bistable circuit. Said further control input is connected to a push-button switching circuit 30. When an operator actuates the push-button circuit, a logical level (0) is substituted to the normal (or "rest") logical level (1) on said further control input and when this switching occurs when input J is at the logical level (1) and input K, at the logical level (0), the output Q is forced from the logical level (0) to the logical level (1).

Figure 2:
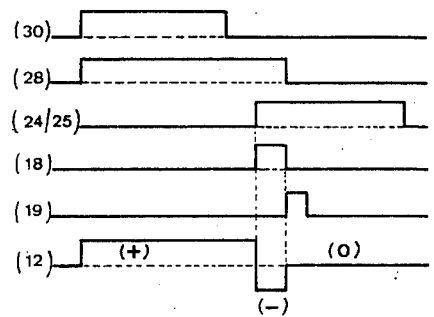
FIG. 2 shows a comparison of electrical waveforms which together with the written description explain how a synchronization index is written on the index track for marking the true origin of an information sequence to be therefrom displayed for inspection purposes.

When the control input 30 is actuated, push-button closed, consequently, the output Q of the bistable circuit 28 is brought to its logical level (1), as shown in graph (30) of FIG. 2 for the variation of level on said further input and graph (28) of FIG. 2 for the resulting level output at Q of the bistable member 28. The output Q is connected to a control input of the circuit 55 which generates the write current for the head 9 of the index track of the carrier 1. The circuit 55 further comprises another input which is controlled from the output condition of a single-shot circuit 18. As long as the Q output is at the logical level (1) whereas the one-shot output remains at the logical level (0), the current generator 55 of the magnetic head 9 is such that the magnetization of the index track is brought to and maintained at a saturation value of a determined direction, see the part of the graph (12) of FIG. 2 marked (+). This graph shows the writing current to the head 9, issuing from the amplifier 12 of FIG. 1. No actual "signal" is read out from the track by the write-read head 9.

When one of the control inputs 24/25 is activated concurrently to 30, as shown in FIG. 2, the one-shot 18 is immediately actuated since it is controlled from the output of the OR-circuit 26. Simultaneously too the conditions of the inputs J and K of the bistable circuit are reversed. The one-shot 18 modifies the operation of the current generator 55 for a reversal of the direction or polarity of the current applied to the amplifier 12 and consequently to the head 9. This change is indicated at (−) on the graph (12) of FIG. 2. When the one-shot 18 returns to rest, it activates a second one-shot circuit 19 connected in cascaded relation to 18. The front edge of the thus modified output of 19 is applied, through a gate 29 which is in conductive condition as controlled from the logical level (1) of the output Q of the bistable circuit 28. The output of gate 29 is connected to the H input of said bistable circuit 28, which is thus switched to its other state wherein the output Q comes to the logical level (0). The index marking the origin of the recorded sequence of information to be then displayed and inspected has been recorded on the synchronization index track. The output of (12) comes to zero as the two inputs of the current generator circuit 55 are brought to the logical level (0). As soon as the output Q of the bistable circuit 28 comes to the logical level (0), it switches the connection inverter switches 3A and 3L, from the write condition to the read condition. The information signals at EA and EL are no longer applied to the heads 2A and 2L but these two heads act as reading heads and have their outputs connected to the inputs of the read-out circuits 5A and 5L. The thus stored information sequences are applied to the display equipment.

At each rotation of the looped carrier, the index which has been written on the synchronization track is read out by the head 9 and the index signal is applied to the shaping circuit 10. The activation of the circuit 10 triggers a bistable flip-flop 52. The output of 52 is connected to an input of a gate 51, the other input of which receives clock pulses for instance from the shaping circuit 50 fed by the magnetic reading head 49 associated to a clock recorded track of the carrier 1. From this and-gate 51, pulses are applied to a pulse counter 53. The counter 53 is provided with a maximum count equal to the number of the clock tops recorded along one turn or track of the carrier. The clock pulse counter is provided with as many digit outputs as are weights of binary digits in its count. These outputs are connected to as many inputs of a code count comparator 56. The other inputs of this comparator 56 receive, in the same number of weights of binary digits, the count elements of a count selector 54 on which the operator can set any count he may wishes from zero to the maximum count of the counter 53. This arrangement enables the operator to define the instant of time at which the synchronization pulse, derived from a the read-out of the origin marking index on the synchronization track of the carrier 1, must be applied to trigger the X (or 0) basis circuit 8 of the display arrangement. The trigger pulse is sent to the circuit 8 each time the comparator 56 detects the identity of the count preset at 54 by the operator and the count at which passes the counter 53 when counting the clock pulses. Said trigger pulse is also applied as a reset pulse to the counter 53 and as a reset pulse to the bistable circuit 52, so that the count of the clock pulses will be re-initiated only at the next read-out of the index by the head 9, when the bistable circuit 52 will be again set and unblock the and-gate 51.

The preset count selector 54 may consist of a keyboard arrangement or a decimal figure roll arrangement the keys or positions of which are so wired as to apply a corresponding binary digit representation to the corresponding inputs of the comparator 56. Consequently, without loss of the true origin of any information sequence, the operator may scan such a sequence on the display, in a step by step fashion, each step defined by the time interval between two successive clock pulses, by modifying the count he presets on the selector 54.

What is claimed is:

1. A system for monitoring evolutive information data picked up at points in an informatics equipment and analyzing selected information data sequences comprising the combination of:

means adapted to be operatively connected to the information equipment to record evolutive information data on a multi-track loop rotatable magnetic carrier and for reading said recorded data, said means comprising as many erase/write and as many reading heads as are tracks, each operable in an erase/write condition or a read-out condition, means for selectively interrupting the recording of said evolutive information and switching the operation of said means for recording and reading from its erase/write condition to its read-out condition, visual display means having inputs connected to display information derived from outputs of the said reading heads, synchronizing means connected to said visual display means for synchronizing the display with the rotation of the said carrier, pulse trigger means for repetitively activating the synchronizing means, means responsive to the interruption of the recording of said data to cause an index marking the origin of the information data sequences to be displayed to be written in or recorded on an index track of said carrier, means to read said index at each rotatation of the said carrier, and, means to convert each read-out of the said index into a trigger pulse applied to the said display synchronizing means, manually controllable means for introducing a variable delay between the read out of the index and the application of a corresponding trigger pulse to the said display synchronizing means, said manually controllable means including
a clock pulse generator,
a clock pulse counter connected to count the clock pulses of said generator,
a manually operable pulse count selector, and
comparator means connected to said counter and said selector for issuing a trigger pulse at the identity of the count in said clock pulse counter and of a count selected in said pulse count selector and for stopping the count in said counter and resetting it to zero up to the next occurrence of the index on the index track of said carrier.

2. In a system for displaying information data sequences repetitively read from recording tracks of a multi-track circulating looped carrier and applied to as many visual display devices each having a direction of scan controlled from a trigger responsive time basis circuit having a trigger pulse actuation input, a time adjustable trigger pulse forming device comprising the combination of:
means for recording a sequence origin marking index on an index track of the carrier,
reading head means associated with said index track,
a clock pulse generator having a clock pulse output,
a clock pulse counter having a clock pulse count input, a clear control input and evolutive count value marking outputs,
a manually adjustable pulse count selector having selected count value marking outputs,
a bistable circuit having an actuation input connected to the output of the said reading head means, and having a reset input and a condition marking output,
gate means connecting the output of the clock pulse generator to the clock pulse count input of the counter and having a control input connected to the condition marking output of said bistable circuit,
comparator means comparing the conditions of the said selected count value marking outputs and of the said evolutive count value marking outputs and having a pulse output activated at the identity of said count values, and,
means connecting the pulse output of the comparator means to the reset input of the bistable circuit, to the clear control input of the clock pulse counter and of the trigger pulse actuation input of the said trigger responsive type time basis.

3. A system according to claim 2, wherein the said clock pulse generator consists of a clock pulse record on a clock track of the said multi-track carrier and said reading head means is operatively associated with said clock track.

4. A visual display device for inspecting recorded information data sequences read from a multi-track rotating looped carrier comprising the combination of:
cathode ray tube display means controlled from the information data sequences read from the carrier for displaying the recorded data,
trigger pulse means for synchronizing the said cathode ray tube display means with the recorded data to be displayed,
means to produce a sequence origin marking pulse at each rotation of the carrier,
clock pulse generating and counting means,
means responsive to each sequence origin marking pulse to start the count of the clock pulse by said counting means,
manually adjustable means to set a predetermined count of clock pulses, and
means to apply a trigger pulse to the trigger pulse responsive synchronizing means when the count in said clock pulse counter reaches the predetermined count set on said manually adjustable means, said trigger pulse further resetting the counter to zero count.

5. A visual display device according to claim 4, wherein the sequence origin marking pulse producing means consists of a sequence origin marking track of the carrier and reading means associated therewith.

6. A visual display device according to claim 5, wherein the clock pulse generating means consists of a clock pulse track of the carrier and reading means associated therewith and connected to the count control input of the clock pulse counter through gate means controlled from said sequence origin marking pulse responsive means.

7. A visual display device according to claim 6, wherein the sequence origin marking pulse responsive means consists of a bistable member actuated by each sequence origin marking pulse and reset by each synchronization trigger pulse.

8. A visual display device according to claim 7, wherein the predetermined count manually adjustable means consists of a key actuated binary code generator, wherein a progressive count binary code generator is controlled from the clock pulse counter and wherein said means to apply the trigger pulses to the synchronizing means consists of a comparator of the said two binary codes having an output activated to each passage to equality of the said codes.

* * * * *